(12) United States Patent
Leenders et al.

(10) Patent No.: US 7,675,123 B2
(45) Date of Patent: *Mar. 9, 2010

(54) PRINTABLE NON-VOLATILE PASSIVE MEMORY ELEMENT AND METHOD OF MAKING THEREOF

(75) Inventors: Luc Leenders, Herentals (BE); Michel Werts, Antwerp (BE)

(73) Assignee: Agfa-Gevaert NV, Mortsel (BE)

( * ) Notice: Subject to any disclaimer, the term of this patent is extended or adjusted under 35 U.S.C. 154(b) by 943 days.

This patent is subject to a terminal disclaimer.

(21) Appl. No.: 11/259,859

(22) Filed: Oct. 27, 2005

(65) Prior Publication Data

US 2006/0102966 A1     May 18, 2006

Related U.S. Application Data (60) Provisional application No. 60/630,185, filed on Nov. 22, 2004.

(30) Foreign Application Priority Data

Oct. 29, 2004   (EP)   .................................. 04105412

(51) Int. Cl.
*H01L 27/088* (2006.01)
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .................. 257/390; 257/40; 257/E51.008

(58) Field of Classification Search .................... 257/40, 257/391, E51.008

See application file for complete search history.

(56) References Cited

U.S. PATENT DOCUMENTS 5,464,989 A     11/1995   Mori et al.

(Continued)

FOREIGN PATENT DOCUMENTS

EP          1 054 414 A1     11/2000

(Continued)

OTHER PUBLICATIONS

European Search Report in 04 10 5412 (Apr. 8, 2005).

(Continued)

*Primary Examiner*—Howard Weiss
*Assistant Examiner*—John C Ingham
(74) *Attorney, Agent, or Firm*—Leydig, Voit & Mayer, Ltd.

(57) ABSTRACT

Passive memory devices comprising a support having at least one conductive surface or surface layer and having on at least one side of the support a passive memory element, the passive memory element comprising a first electrode system, an insulating system and a second electrode system, wherein the first electrode system is insulated from the second electrode system, wherein the first electrode system is a conductive surface, or a conductive layer of a support, the second electrode system is a plurality of isolated conductive areas and/or a plurality of conducting pins isolated from one another; and conductive bridges are present between at least one of the isolated conductive area, or at least one of the conducting pins, and the first electrode system; wherein with the exception of the first electrode system being a conductive surface of a support, the systems and the conductive bridges are printable using conventional printing processes.

11 Claims, 1 Drawing Sheet

U.S. PATENT DOCUMENTS

| | | |
|---|---|---|
| 5,840,608 A | 11/1998 | Chang |
| 6,055,180 A | 4/2000 | Gudesen et al. |
| 6,107,666 A | 8/2000 | Chang |
| 6,380,597 B1 * | 4/2002 | Gudesen et al. ............. 257/390 |
| 6,542,397 B2 | 4/2003 | Mills, Jr. |
| 6,649,499 B2 | 11/2003 | Mills, Jr. |
| 6,656,763 B1 | 12/2003 | Oglesby et al. |
| 6,870,183 B2 * | 3/2005 | Tripsas et al. ................. 257/40 |
| 2001/0039124 A1 | 11/2001 | Shimoda |
| 2002/0016440 A1 | 2/2002 | Louwet et al. |
| 2003/0057403 A1 | 3/2003 | Willaert et al. |
| 2003/0062510 A1 | 4/2003 | Van Den Bogaert |
| 2003/0144465 A1 | 7/2003 | Leenders et al. |
| 2003/0211241 A1 | 11/2003 | Tahon et al. |
| 2003/0211331 A1 | 11/2003 | Louwet et al. |
| 2003/0215571 A1 | 11/2003 | Tahon et al. |
| 2003/0230746 A1 | 12/2003 | Stasiak |
| 2004/0096695 A1 | 5/2004 | Willaert et al. |
| 2004/0149552 A1 | 8/2004 | Moeller et al. |
| 2005/0040372 A1 | 2/2005 | Tahon et al. |

FOREIGN PATENT DOCUMENTS

| | | |
|---|---|---|
| WO | WO 02/29706 A1 | 4/2002 |
| WO | WO 02/079316 A2 | 10/2002 |
| WO | WO 03/000765 A2 | 1/2003 |
| WO | WO 03/048228 A1 | 6/2003 |
| WO | WO 03/048229 A1 | 6/2003 |

OTHER PUBLICATIONS

Smith et al.; "A Low Switching Voltage Organic-on-Inorganic Heterojunction Memory Element Utilizing a Conductive Polymer Fuse on a Doped Silicon Substrate;" vol. 84, No. 24; pp. 5019-5021 (Jun. 14, 2004).

* cited by examiner

PRINTABLE NON-VOLATILE PASSIVE MEMORY ELEMENT AND METHOD OF MAKING THEREOF

CROSS-REFERENCE TO RELATED PATENT APPLICATIONS

This application claims the benefit of U.S. Provisional Application No. 60/630,185 filed Nov. 22, 2004, which is incorporated by reference. In addition, this application claims the benefit of European Application No. 04105412.3 filed Oct. 29, 2004, which is also incorporated by reference.

FIELD OF THE INVENTION

The present invention concerns a printable passive memory element and method of making same.

BACKGROUND OF THE INVENTION

There is currently an increasing demand for disposable, inexpensive, flexible, passive memory device-containing tags and labels in which information is stored, for example as anti-counterfeiting tags in packaging. Production of such non-volatile memory elements, including writing of the information, should be easy and inexpensive and preferably should be capable of being incorporated in the tag, label and package printing process or in the packaging process itself and should consist of uncomplicated and inexpensive materials and involve a minimum of processing steps. For use in packages, it is important that the memory device is relatively robust and fairly insensitive to mechanical shock, temperature changes and other environmental influences.

Conventional silicon-based semiconductor memories have the disadvantage of requiring expensive and complex processing, the high process temperatures and the non-flexibility making them unsuitable for use on packaging substrates. Moreover, silicon-based semiconductor memories pose considerable environmental issues upon disposal. U.S. Pat. No. 6,542,397 discloses an apparatus comprising: at least one designated memory cell of a plurality of memory cells, each designated memory cell having a resistance-altering constituent disposed therein, but only exemplifies silicon-based read-only resistor memories. U.S. Pat. No. 6,649,499 discloses a method of making a memory comprising: diffusing of a resistance-altering constituent into a plurality of memory cells, the plurality of memory cells comprising polycrystalline silicon and the resistance-altering constituent comprising at least one Group IA element; and moving at least a portion of an implanted dose of the resistance-altering constituent from the conductive layer of at least one memory cell. In these resistor memories, information is stored by alteration of the resistance at pre-selected crossing points. Crosstalk between adjacent word lines are reduced if the resistance in each memory cell is significantly higher than the resistance of the bit lines and word lines. However, this does not prevent the existence of alternative current paths.

U.S. Pat. No. 6,107,666 discloses a high density ROM device, comprising: a substrate; and at least one memory array, including: a first insulating layer located over a surface of the substrate, plural bit lines located over the first insulating layer and extending in a first direction, said bit lines being spaced from one another at essentially equal intervals; a second insulating layer formed over the plural bit lines, at least one via formed in the second insulating layer and exposing a portion of the bit lines, and plural word lines located over the second insulating layer and extending in a second direction that crosses the first direction to form an angle, said word lines being spaced from one another at essentially equal intervals; and wherein some of the word lines are connected to the bit lines using the via and some of the word lines are isolated from the bit lines using the second insulating layer. U.S. Pat. No. 6,107,666 discloses a read only memory device which is not based on silicon, but in which metal bit lines and word lines are present. Electrical interconnects are made by the application of a metal in pre-selected vias present between the bit lines and word lines.

However, the production processes for the resistor memory cells disclosed in U.S. Pat. No. 6,107,666, U.S. Pat. No. 6,542,397 and U.S. Pat. No. 6,649,499 all rely on evaporation and etching methods to apply the metal or silicon structures, requiring high temperatures in the range of 300° C. to 400° C., which results in melting or severe degradation of polymer-based or paper-based substrates, hence making it unsuitable for packaging. Therefore such metal or silicon structures neither lend themselves to incorporation into tag, label and package printing process or into the packaging process nor do they lend themselves to environmentally friendly disposal.

Information can be stored electrically in a WORM memory by using the anti-fuse principle. U.S. Pat. No. 6,656,763, for example, discloses a method of making an organic memory cell comprising: providing a first electrode; forming a passive layer comprising a conductivity facilitating compound over the first electrode; forming an organic semiconductor layer over the passive layer using a spin-on technique, the spin-on technique comprising applying a mixture of i) at least one of a conjugated organic polymer, a conjugated organometallic compound, a conjugated organometallic polymer, a buckyball, and a carbon nanotube and ii) at least one solvent selected from the group consisting of glycol ether esters, glycol ethers, furans, and alkyl alcohols containing from about 4 to about 7 carbon atoms; and providing a second electrode over the organic semiconductor layer.

Furthermore, US 2004/0149,552A1 discloses an electronic switch comprising: a first conductor; a second conductor; and a conductive organic polymer layer in contact with, and lying between, the first conductor and the second conductor, the conductive organic polymer layer in one of a first state in which the organic polymer layer conducts current between the first conductor and the second conductor with relatively high conductivity, and a second state, in which the organic polymer layer conducts current between the first conductor and the second conductor with relatively lower conductivity. The resistance of a semiconductor layer present between word lines and bit lines can be electrically altered by applying a 'high' voltage pulse, thereby increasing the resistance. To prevent alternative current paths it is necessary to include additional layers between the word lines and bit lines in each memory cell to form diodes, hereby making the manufacturing process more complicated.

The printing of memories has been proposed in the art for several different types of devices. US 2003/0230,746A1 discloses a memory device comprising: a first semiconducting polymer film having a first side and a second side, wherein said first semiconducting polymer film includes an organic dopant; a first plurality of electrical conductors substantially parallel to each other coupled to said first side of said first semiconducting polymer layer; and a second plurality of electrical conductors substantially parallel to each other, coupled to said second side of said first semiconducting polymer layer and substantially mutually orthogonal to said first plurality of electrical conductors, wherein an electrical charge is localized on said organic dopant. The structures of the doped semiconducting film, layered between two conducting line patterns are simple. However, these memories are volatile, and the information is lost if no power is applied. US 2001/039124A1 discloses a method for manufacturing a memory device which stores a state in accordance with the presence or the absence of a covering insulating film on a surface of an electrode at a memory cell position, the method comprising: selectively ejecting the insulating material using an inkjet head to the surface of the electrode at a predetermined memory cell position so as to cover the surface of the electrode at the predetermined memory cell position with the insulating material.

WO 02/0029706A1 discloses an electronic bar code comprising: a bar code circuit that stores a code that is electronically readable, wherein the code is defined by a polymer printing process; and an interface coupled to the bar code circuit to allow a bar code reader to access the code stored in the bar code circuit. However, the printed electronic circuit does not consist of a passive matrix but a number of electronic components of which the presence or absence of the component or its connection determines the stored information.

U.S. Pat. No. 5,464,989 discloses a mask ROM having a plurality of memory cells, comprising: a semiconductor substrate having a main surface; a plurality of parallel first signal lines extending in a column direction on said main surface of said semiconductor substrate, a plurality of parallel second signal lines extending in a row direction on said main surface of said semiconductor substrate, crossing said plurality of first signal lines at a plurality of crossovers each forming a respective memory cell of said plurality of memory cells; an insulation film formed between said plurality of first signal lines and said plurality of second signal lines; and selecting means for selecting one of said plurality of first signal lines and one of said plurality of second signal lines and causing electric field between the selected first signal line and the selected second signal line by applying potential difference between the selected first signal line and the selected second signal line, said insulation film having, at each of said plurality of crossovers for storing data, one of i) a first thickness necessary for keeping an insulating state between the selected first signal line and the selected second signal line even if an electric field is received between the first signal line selected by the selecting means and the second signal line selected by the selecting means, ii) a second thickness for causing a first tunnel current to flow between the selected first signal line and the selected second signal line when the electric field is received between the first signal line and the second signal line selected by the selecting means, and iii) a third thickness for causing a second tunnel current to flow between the selected first signal line and the selected second signal line when the electric field is received between the first signal line and the second signal line selected by the selecting means. The production of a passive matrix ROM is thereby disclosed in U.S. Pat. No. 5,464,989 based on conductive electrodes, separated by an isolating oxide film in which a tunnel phenomenon is generated with storage of multiple bit levels in one memory cell. Variations in the oxide layer thickness leads to different tunnel currents through the layer, which encode for multiple levels in the information in each cell.

WO 02/079316A discloses an aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder; a method for preparing a conductive layer comprising: applying the above-described aqueous composition to an optionally subbed support, a dielectric layer, a phosphor layer or an optionally transparent conductive coating; and drying the thereby applied aqueous composition; antistatic and electroconductive coatings prepared according to the above-described method for preparing a conductive layer; a printing ink or paste comprising the above-described aqueous composition; and a printing process comprising: providing the above-described printing ink; printing the printing ink on an optionally subbed support, a dielectric layer, a phosphor layer or an optionally transparent conductive coating. However, WO 02/079316A only discloses the application of such inks for applying antistatic or electroconductive layers to an optionally subbed support, a dielectric layer, a phosphor layer or an optionally transparent conductive layer, which may be a step in the production of electroluminescent devices which can be used in lamps, displays, back-lights e.g. LCD, automobile dashboard and keyswitch backlighting, emergency lighting, cellular phones, personal digital assistants, home electronics, indicator lamps and other applications in which light emission is required.

WO 03/000765A discloses a non-dye containing flexographic ink containing a polymer or copolymer of a 3,4-dialkoxythiophene in which the two alkoxy groups may be the same or different or together represent an optionally substituted oxy-alkylene-oxy bridge, a polyanion and a latex binder in a solvent or aqueous medium, characterized in that the polymer or copolymer of a 3,4-dialkoxythiophene is present in a concentration of at least 0.1% by weight in the ink and that the ink is capable of producing a colorimetrically additive transparent print; a method of preparing the flexographic ink; and a flexographic printing process therewith. However, WO 03/000765A only indicates the application of such inks for applying antistatic and electroconductive patterns to an optionally subbed support, a dielectric layer, a phosphor layer and a transparent conductive layer, which may be a step in the production of electrical circuitry for single and limited use items such as toys, in capacitive antennae as part of radiofrequency tags, in electroluminescent devices which can be used in lamps, displays, back-lights e.g. LCD, automobile dashboard and keyswitch back-lighting, emergency lighting, cellular phones, personal digital assistants, home electronics, indicator lamps and other applications in which light emission is required.

There is therefore a need for an easy and inexpensive means of storing information which can be easily incorporated in a tag, label or package printing process or the packaging process itself. Moreover, such easy and inexpensive means of storing information must be capable of lending itself to environmentally friendly disposal.

ASPECTS OF THE INVENTION

It is therefore an aspect of the present invention to provide inexpensive non-volatile memory elements.

It is therefore a further aspect of the present invention to realize an easy and inexpensive means of storing information which can be easily incorporated in a tag, label or package printing process or the packaging process itself.

It is a further aspect of the present invention to realize an easy and inexpensive means of storing information which is capable of lending itself to environmentally friendly disposal.

It is a still further aspect of the present invention to realize an electronic device which is characterized in that pads of an electrical conducting or semiconducting material are provided on a conductive surface and that an isolating material is provided between the first and second electrode, such that the two electrode planes are on top of one another without direct physical and electrical contact, and that an electrical conducting or semiconducting material is provided at pre-selected positions, contacting both the first and second electrode to make an electrical interconnect (conductive bridge).

Further aspects and advantages of the invention will become apparent from the description hereinafter.

SUMMARY OF THE INVENTION

It has been surprisingly found that an element comprising a first electrode system, a second patterned electrode system, an insulating system between the first electrode system and the second patterned electrode system and at least one conductive bridge between the first electrode system and the second patterned electrode system, wherein the first electrode system is a conductive surface, or a conductive layer and wherein in the absence of the at least one conductive bridge there is no direct electrical contact between the first and the second electrode systems, is printable by conventional printing processes.

Aspects of the present invention are realized by a passive memory element comprising a first electrode system and a second electrode system, wherein the first electrode system is insulated from the second electrode system by a patterned insulating system, wherein the first electrode system is a conductive surface, or a conductive layer; wherein the second electrode system is a plurality of isolated conductive areas and/or a plurality of conducting pins isolated from one another; wherein conductive bridges are present between at least one of the isolated conductive areas of the second electrode system and the first electrode system or at least one conductive blob is provided from at least one predesignated point on the side of the insulating system not contiguous with the first electrode system to the conductive surface or the conductive layer which makes a conductive bridge, for read-out purposes only, between the first and the second electrode systems upon one of the plurality of conductive pins of the second electrode system coming into contact with the part of the conductive blob on the patterned insulating system; wherein in the absence of the at least one conductive bridge there is no direct electrical contact between the first and the second electrode systems; and wherein, with the exception of the first electrode system being the conductive surface of a metallic support, the systems, the at least one conductive bridge and the at least one conductive blob are printable using conventional printing processes.

Aspects of the present invention are also realized by a first passive memory device comprising at least one passive memory element and a support having at least one conductive surface or surface layer on the at least one side provided with the passive memory element, the passive memory element comprising a first electrode system and a second electrode system, wherein the first electrode system is insulated from the second electrode system by a patterned insulating system, wherein the first electrode system is a conductive surface, or a conductive layer; wherein the second electrode system is a plurality of isolated conductive areas optionally together with a plurality of conductive pins isolated from one another; wherein conductive bridges are present between at least one of the isolated conductive areas of the second electrode system and the first electrode system; wherein in the absence of the at least one conductive bridge there is no direct electrical contact between the first and the second patterned electrode systems; and wherein, with the exception of the first electrode system being the conductive surface of a metallic support, the systems and the conductive bridges are printable using conventional printing processes.

Aspects of the present invention are also realized by a precursor for a second passive memory device comprising a support and on at least one side of the support: a conductive surface of the support or a conductive layer on the support, a patterned insulating system on the conductive surface or the conductive layer and at least one conductive blob linking the conductive surface or the conductive layer to at least one position on the patterned insulating system, wherein the optional conductive layer, the patterned insulating system and the at least one conductive blob are printable using conventional printing techniques.

Aspects of the present invention are also realized by a second passive memory device comprising at least one passive memory element and a support having at least one conductive surface or surface layer on the at least one side provided with the passive memory element, the passive memory element comprising the conductive surface of the support or the surface layer on the support as a first electrode system, an insulating system, at least one conductive blob is provided from at least one predesignated point on the side of the insulating system not contiguous with the first electrode system to the first electrode system which makes a conductive bridge, for read-out purposes only, between the first and the second electrode systems upon one of the plurality of conductive pins of the second electrode system coming into contact with the part of the conductive blob on the patterned insulating system, wherein in the absence of the at least one conductive bridge there is no direct electrical contact between the first electrode system and second electrode system; and wherein, with the exception of the first electrode system being the conductive surface of a metallic support, the systems and the at least one conductive blob are printable using conventional printing processes.

Aspects of the present invention are also realized by a process for providing a first passive memory device comprising at least one passive memory element and a support having at least one conductive surface or conductive layer on the at least one side provided with the passive memory element, the passive memory element comprising a first electrode system and a second electrode system, wherein the first electrode system is insulated from the second electrode system, wherein the first electrode system is a conductive surface, or a conductive layer; wherein the second electrode system is a plurality of isolated conductive areas optionally together with a plurality of conductive pins isolated from one another; wherein conductive bridges are present between at least one of the isolated conductive areas of the second electrode system and the first electrode system; wherein in the absence of the at least one conductive bridge there is no direct electrical contact between the first and the second patterned electrode systems; and wherein, with the exception of the first electrode system being the conductive surface of a metallic support, the systems and the conductive bridges are printable using conventional printing processes, comprising the steps of: providing the support, realizing the conductive layer on the support if the support is non-metallic; realizing a patterned insulating system on the conductive surface or conductive layer, providing a plurality of isolated conducting areas on the patterned insulating system, and providing conductive bridges at predesignated points between at least one of the isolated conductive areas and the conductive surface or the conductive layer, wherein at least one of the steps of optionally providing a conductive layer, providing an patterned insulating system, providing a plurality of isolated conducting areas and providing conductive bridges is realized with a conventional printing process.

Aspects of the present invention are also realized by a process for providing a precursor for a second passive memory device, the precursor comprising a support and on at least one side of the support: a conductive surface of the support or a conductive layer on the support, a patterned insulating system on the conductive surface or the conductive layer and at least one conductive blob linking the conductive surface or the conductive layer to at least one position on the patterned insulating system, wherein the optional conductive layer, the patterned insulating system and the at least one conductive blob are printable using conventional printing techniques, comprising the steps of: providing the support, realizing the conductive layer on the support if the support is non-metallic, realizing the patterned insulating system and providing conductive blobs at predesignated points from the side of the insulating system not contiguous with the first electrode system to the conductive surface or the conductive layer, wherein at least one of the steps of optionally providing a conductive layer, providing the insulating system, and providing the the conductive blobs is realized with a conventional printing process.

Aspects of the present invention are also realized by a A process for providing a second passive memory device, the passive memory device comprising at least one passive memory element and a support having at least one conductive surface or surface layer on the at least one side provided with the passive memory element, the passive memory element comprising the conductive surface of the support or the surface layer on the support as a first electrode system, an insulating system, at least one conductive blob is provided from at least one predesignated point on the side of the insulating system not contiguous with the first electrode system to the first electrode system which makes a conductive bridge, for read-out purposes only, between the first and the second electrode systems upon one of the plurality of conductive pins of the second electrode system coming into contact with the part of the conductive blob on the patterned insulating system, wherein in the absence of the at least one conductive bridge there is no direct electrical contact between the first electrode system and second electrode system; and wherein, with the exception of the first electrode system being the conductive surface of a metallic support, the systems and the at least one conductive blob are printable using conventional printing processes, comprising the steps of: providing the support, realizing the conductive layer on the support if the support is non-metallic, realizing the patterned insulating system, providing at least one conductive blob from at least one predesignated point on the side of the insulating system not contiguous with the first electrode system to the conductive surface or the conductive layer and realizing a plurality of pins as the second electrode system for read-out purposes only, wherein at least one of the steps of optionally providing a conductive layer, providing the insulating system, providing the conductive blobs and providing the second electrode system is realized with a conventional printing process.

Preferred embodiments of the present invention are disclosed in the detailed description of the invention.

DETAILED DESCRIPTION OF THE INVENTION

Definitions

The term passive memory, as used in disclosing the present invention, means a non-volatile memory i.e. read-only memory and is to be distinguished from reversible memories.

The term "support", as used in disclosing the present invention, means a "self-supporting material" so as to distinguish it from a "layer" which may be coated on a support, but which is itself not self-supporting. It also includes any treatment necessary for, or layer applied to aid, either adhesion to a conductive surface layer or to an insulating system.

The term printable, as used in disclosing the present invention, means capable of being printed by conventional impact and/or non-impact printing processes and excludes processes such as evaporation, etching, diffusion processes used in the production of conventional electronics e.g. silicon-based electronics.

The term conventional printing processes, as used in disclosing the present invention, includes but is not restricted to ink-jet printing, intaglio printing, screen printing, flexographic printing, offset printing, stamp printing, gravure printing and thermal and laser-induced processes.

The term impact printing process, as used in disclosing the present invention, means a printing process in which contact is made between the medium in which the print is produced and the printing system e.g. printers that work by striking an ink ribbon such as daisy-wheel, dot-matrix and line printers, and direct thermal printers in which the thermographic material is printed by direct contact with heating elements in a thermal head and printers in which a master is covered with an ink layer on areas corresponding to a desired image or shape, after which the ink is transferred to the medium, such as offset, gravure or flexographic printing.

The term non-impact printing process, as used in disclosing the present invention, means a printing process in which no contact is made between the medium in which the print is produced and the printing system e.g. electrographic printers, electrophotographic printers, laser printers, ink jet printers in which prints are produced without needing to strike the print medium.

The term conductive bridge, as used in disclosing the present invention, means a conductive blob having any shape providing an electrical contact between the first and second electrode systems, which can be permanent or for read-out purposes only. An example of a permanent conductive bridge is one between an isolated conductive area (second electrode system) and a conductive surface or a conductive layer (first electrode system). An example of a conductive bridge for read-out purposes only is one which is formed upon contact between the end of a conductive blob, forming a bridge between a conductive surface or a conductive layer (first electrode system) and a position on the side of the insulating system not contiguous with the first electrode system, on the insulating system with a predesignated pin (second electrode system).

The term pattern, as used in disclosing the present invention, means a non-continuous layer which can be in any form of lines, squares, circles or any random configuration.

The term layer, as used in disclosing the present invention, means a coating covering the whole area of the entity referred to e.g. a support.

The term conducting pin, as used in disclosing the present invention, means a conducting object capable of making contact to a conducting surface and can have any shape, and any profile, for example a square, rectangular, circular or ellipsoidal profile with for example dimensions in the range of 10 µm to 10 mm, provided that no contact is made with neighbouring pins and contact with the conducting surface or conductive layer is realized. The conducting pins may therefore be conductive pads.

The term metallized support, as used in disclosing the present invention, means a support at least one surface of which is covered with metal by any process known to one skilled in the art e.g. printing, lamination, attachment of metal foil, sputtering and evaporation.

The term insulating layer, as used in disclosing the present invention, is a layer having high electrical resistance used for separating conducting layers, which prevents an undesired flow of current between conducting layers contiguous with either side of the insulating layer and specifically is a layer providing a leak current between two electrodes of <5 µA measured at a voltage of 5V.

The term conductive is related to the electric resistance of the material, the electric resistance of a layer being generally expressed in terms of surface resistance $R_s$ (unit $\Omega$; often specified as $\Omega$/square). Alternatively, the conductivity may be expressed in terms of the specific (volume) resistivity $R_v = R_s \cdot d$, wherein d is the thickness of the layer, and $R_v$ or $\rho$ is in units of ohm-cm. The term conductive, as used in disclosing the present invention, means a material having a surface resistance of $<10^6$ ohm/square, preferably <10 ohm/square or having a specific resistivity of $<10^2$ ohm-cm, preferably <1 ohm-cm.

The term intrinsically conductive polymer, as used in disclosing the present invention, means organic polymers which have (poly)-conjugated $\pi$-electron systems (e.g. double bonds, aromatic or heteroaromatic rings or triple bonds) and whose conductive properties are not influenced by environmental factors such as relative humidity.

The term transparent, as used in disclosing the present invention, means having the property of transmitting at least 70% of the incident light without diffusing it.

The term flexible, as used in disclosing the present invention, means capable of following the curvature of a curved object such as a drum e.g. without being damaged.

PEDOT, as used in disclosing the present invention, represents poly(3,4-ethylenedioxythiophene).

PSS, as used in disclosing the present invention, represents poly(styrene sulfonic acid) or poly(styrene sulfonate).

PANI, as used in disclosing the present invention, represents polyaniline.

Passive Memory Element

Aspects of the present invention are realized by a passive memory element comprising a first electrode system and a second electrode system, wherein the first electrode system is insulated from the second electrode system by a patterned insulating system, wherein the first electrode system is a conductive surface, or a conductive layer; wherein the second electrode system is a plurality of isolated conductive areas and/or a plurality of conducting pins isolated from one another; wherein conductive bridges are present between at least one of the isolated conductive areas of the second electrode system and the first electrode system or at least one conductive blob is provided from at least one predesignated point on the side of the insulating system not contiguous with the first electrode system to the conductive surface or the conductive layer which makes a conductive bridge, for read-out purposes only, between the first and the second electrode systems upon one of the plurality of conductive pins of the second electrode system coming into contact with the part of the conductive blob on the patterned insulating system; wherein in the absence of the at least one conductive bridge there is no direct electrical contact between the first and the second electrode systems; and wherein, with the exception of the first electrode system being the conductive surface of a metallic support, the systems, the at least one conductive bridge and the at least one conductive blob are printable using conventional printing processes.

According to a first embodiment of the passive memory element, according to the present invention, the second electrode system is a plurality of conducting pins, which are part of a read-out device.

According to a second embodiment of the passive memory element, according to the present invention, the second electrode system is a plurality of isolated conductive areas.

The passive memory element, according to the present invention, can be produced in an inexpensive way by reel-to-reel printing. The printing process consists of at least one step, a) optionally printing a conductive layer being the first electrode system on a non-metallic support, b) printing of a pattern of an insulating material on a conductive substrate, c) optionally printing of the conductive pads of a second electrode on the insulating material thereby realizing the second electrode pattern, such that the two electrode planes are on top of one another without direct physical and electrical contact.

Information is then stored either by the separate printing of a conducting material at pre-selected positions to form conductive bridges or the information is stored together with the printing of the second electrode pattern step in the printing of the passive memory element.

Such an off-line step of storing the information by applying conductive bridges on pre-selected positions between the conductive surface of the substrate and the second electrode pattern can be carried out by, for example, ink-jet printing, at the same or at a different location, at the same time or at a later time. This enables the personalization of each passive memory element with different information.

The passive memory element, according to the present invention, is producible by a printing process. Information may be stored by creating conductive bridges via a printing process.

In another embodiment, information is stored in the memory device by a combination of two or more printing steps, for example one part of the information is printed together with the second electrode and a second part is printed in a separate printing step in which additional 'conductive bridges' are printed. The first part of information might contain fixed information such as the name of a manufacturer, while the second part is variable, such as the production date or batch number.

According to a third embodiment of the passive memory element, according to the present invention, the passive memory element comprises a first electrode system, an insulating system and a second electrode system, wherein the first electrode system is insulated from the second electrode system, wherein the first electrode system is a conductive surface or a conductive layer of a support, wherein the second electrode system is a plurality of isolated conductive areas, or a plurality of conducting pins isolated from one another, wherein at least one conductive bridge is present between at least one conducting pin and the first electrode system, wherein with the exception of the first electrode system being a conductive surface, the systems and the conductive bridges are printable using conventional printing processes.

Passive Memory Element—Operation

The present invention provides a passive memory device comprising at least one simple passive memory element, that is producible by printing processes, in which information is stored by providing electrical interconnects (conductive bridges) between a conductive surface or conductive layer (first electrode) and the second electrode system at pre-selected positions. Information is stored by the presence or absence of a conductive bridge. The conductive surface or conductive layer and second electrode system are electrically insulated from one another by an insulating system (material). By means of printing of a conducting system at a pre-selected position, a conductive bridge is formed between the conductive surface or conductive layer (first electrode system) and the second electrode system. Read-out of the data is accomplished by measuring the resistance between the conductive surface or conductive layer (first electrode system) and the second electrode system for all possible positions. The resistivity can be read-out electrically in contact or capacitively and corresponds to logical values in a binary code.

The structure of the passive memory element in the passive memory device, according to the present invention, preferably comprises a two-dimensional array of electrically conductive pads on a conductive surface and comprising an insulating material between the first and second electrodes, such that the two electrode planes are on top of one another without direct physical and electrical contact, and comprising an electrical conducting or semiconducting material, provided at pre-selected positions of the first and second electrode, contacting both the first and second electrode to make a conductive bridge.

Another aspect of the present invention relates to the retrieval of the covert information in the memory device by subsequent measurement of the resistance between the conductive surface and each conductive pad, wherein a low resistance, corresponding to an electrical conductive bridge, denotes one binary state and a high resistance, corresponding to a conductive pad without an electrical conductive bridge, denotes a second binary state.

Passive Memory Device—Configuration

Aspects of the present invention are realized by a first passive memory device comprising at least one passive memory element and a support having at least one conductive surface or surface layer on the at least one side provided with the passive memory element, the passive memory element comprising a first electrode system and a second electrode system, wherein the first electrode system is insulated from the second electrode system by a patterned insulating system, wherein the first electrode system is a conductive surface, or a conductive layer; wherein the second electrode system is a plurality of isolated conductive areas optionally together with a plurality of conductive pins isolated from one another; wherein conductive bridges are present between at least one of the isolated conductive areas of the second electrode system and the first electrode system; wherein in the absence of the at least one conductive bridge there is no direct electrical contact between the first and the second patterned electrode systems; and wherein, with the exception of the first electrode system being the conductive surface of a metallic support, the systems and the conductive bridges are printable using conventional printing processes.

Aspects of the present invention are realized by second passive memory device comprising at least one passive memory element and a support having at least one conductive surface or surface layer on the at least one side provided with the passive memory element, the passive memory element comprising the conductive surface of the support or the surface layer on the support as a first electrode system, an insulating system, at least one conductive blob is provided from at least one predesignated point on the side of the insulating system not contiguous with the first electrode system to the first electrode system which makes a conductive bridge, for read-out purposes only, between the first and the second electrode systems upon one of the plurality of conductive pins of the second electrode system coming into contact with the part of the conductive blob on the patterned insulating system, wherein in the absence of the at least one conductive bridge there is no direct electrical contact between the first electrode system and second electrode system; and wherein, with the exception of the first electrode system being the conductive surface of a metallic support, the systems and the at least one conductive blob are printable using conventional printing processes.

According to a first embodiment of the passive memory devices, according to the present invention, the first or second passive memory device is exclusive of metallic silicon.

According to a second embodiment of the passive memory devices, according to the present invention, the support is a flexible or rigid plastic, glass, paper, board, carton or a composite material of any of these materials.

According to a third embodiment of the passive memory devices, according to the present invention, the support is a metallic support, a metallized support or a support provided with a conductive layer.

According to a fourth embodiment of the passive memory devices, according to the present invention, at least one of the conductive surface, the second patterned electrode systems and the at least one conductive bridge comprises an inorganic conducting medium, e.g. a metal, a semiconducting metal oxide and carbon, or an organic conducting medium, e.g. an intrinsically conductive organic polymer.

According to a fifth embodiment of the passive memory devices, according to the present invention, at least one of the conductive surface, the second patterned electrode systems and the at least one conductive bridge comprises an organic conducting medium, which is an intrinsically conductive organic polymer.

According to a sixth embodiment of the passive memory devices, according to the present invention, at least one of the conductive surface, the second patterned electrode systems and the at least one conductive bridge comprises a polythiophene, a polyaniline or a polypyrrole.

According to a seventh embodiment of the passive memory devices, according to the present invention, at least one of the conductive surface, the second patterned electrode systems and the at least one conductive bridge comprises a poly(3,4-dioxyalkylenethiophene).

According to an eighth embodiment of the passive memory devices, according to the present invention, at least one of the conductive surface, the second patterned electrode systems and the at least one conductive bridge comprises poly(3,4-dioxyethylenethiophene).

According to a ninth embodiment of the passive memory devices, according to the present invention, at least one of the conductive surface, the second patterned electrode systems and the at least one conductive bridge comprises carbon.

According to a tenth embodiment of the passive memory devices, according to the present invention, at least one of the conductive surface, the second patterned electrode systems and the at least one conductive bridge comprises a metal e.g. silver or gold.

According to an eleventh embodiment of the passive memory devices, according to the present invention, at least one of the conductive surface, the second patterned electrode systems and the at least one conductive bridge comprises a semiconducting metal oxide or doped metal oxide e.g. vanadium pentoxide, indium tin oxide or a metal antimonate.

The conductivity of the electrodes and conductive bridges needs to be sufficient to have a current flowing through a conductive bridge that is significantly higher than the current measured without a conductive bridge. The resistance is preferably in the range of 1 Ohm to 100 kOhm per square and more preferably lower than 20,000 Ohm per square. The width and length of the isolated conductive areas can be in the range from 5 µm to 10 mm and more preferably from 100 µm to 0.5 mm.

The position of the 'conductive bridges' in the memory device may be different for each device, thus storing personalized/individual information, such as name, address, date of birth, etc or a products' manufacturing date/time and pricing.

According to a twelfth embodiment of the passive memory devices, according to the present invention, the passive memory device is transparent, thereby becoming almost invisible to the unaided eye. This can be realized by using for example PEDOT:PSS as the conductive material for the electrodes and 'conductive bridges', and by using a transparent isolating material, for example a UV-curable ink.

According to a thirteenth embodiment of the passive memory device, according to the present invention, the passive memory device may be combined with one or more security features e.g. security inks based on magnetic, infrared-absorbing, thermochromic, photochromic, coin-reactive, optically variable, fluorescent or phosphorescent compounds and the like, chemical or biological taggants based on isotopes, DNA, antibodies or specific detectable ingredients and the like can be included in one of the layers of the memory device. The memory device may be overcoated or overprinted with a hologram, tamper proof security film, a barcode or the like. The memory device, according to the present invention, may be printed on security paper.

According to a fourteenth embodiment of the passive memory devices, according to the present invention, the number of conductive bridges is at least two.

According to a fifteenth embodiment of the first passive memory device, according to the present invention, the 'conductive bridges' are coloured, for example black by using a carbon black-based ink.

According to a sixteenth embodiment of the first passive memory device, according to the present invention, to visually hide the location of the 'conductive bridges', non-conducting black bridges may be printed on the remaining positions without conductive bridges. The conducting and non-conducting bridges may have any colour, for example by adding dyes or pigments.

According to a seventeenth embodiment of the first passive memory device, according to the present invention, the memory device is overprinted with an image or homogeneously coloured or opaque layer to visually hide the location of the 'conductive bridges'.

According to an eighteenth embodiment of the first passive memory device, according to the present invention, a coloured or opaque foil is laminated over the memory device to visually hide the location of the 'conductive bridges'.

According to a nineteenth embodiment of the first passive memory device, the first passive memory device comprises a support having at least one conductive surface or surface layer and on at least one side of the support a passive memory element, the passive memory element comprising a conductive surface or the surface layer of the support, a plurality of isolated conductive areas and a patterned insulating system between the conductive surface or surface layer of the support and the plurality of isolated conducting areas, there being a conductive bridge between at least one predesignated isolated conductive area of the plurality of isolated conductive areas and the conductive surface or surface layer of the support, wherein the passive memory element is producible using conventional printing processes and is exclusive of silicon metal and in the absence of the at least one conductive bridge there is no direct electrical contact between the first and the second patterned electrode systems.

According to a fifteenth embodiment of the second passive memory device, the second passive memory device comprises a support having at least one conductive surface or surface layer and on at least one side of the support a passive memory element, according to claim 1, the passive memory element comprising the conductive surface or the surface layer of the support, a plurality of conducting pins isolated from another making contact with the patterned insulating system thereby being a second electrode system, there being a conductive bridge between at least one predesignated conductive pin and the conductive surface or surface layer of the support, wherein the passive memory element excluding the conducting pins is producible using conventional printing processes and is exclusive of silicon metal and in the absence of the at least one conductive bridge there is no direct electrical contact between the first electrode system and the at least one of the plurality of conducting pins.

Figure 1A:
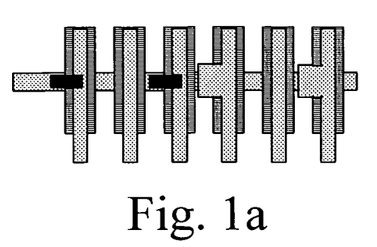
FIG. 1 shows a top view of two memory devices with a continuous first electrode according to an embodiment of the present invention.
Figure 1B:
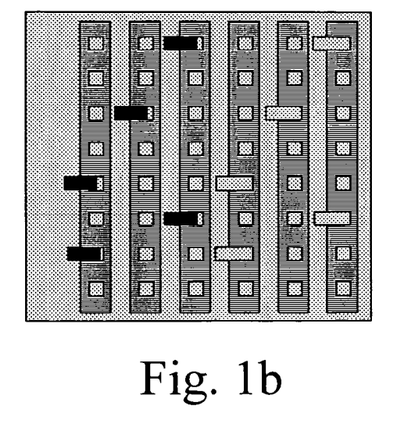

In one embodiment, the first electrode is continuous, the second electrode can be one-dimensional (one row of conducting lines, FIG. 1a) or two-dimensional (patches/dots of a conducting or semiconducting material in an array configuration). The first electrode may be an integral part of a package, such as a metallic blister package. The second electrode is physically and electrically isolated from the first electrode. Conductive bridges are made at pre-selected positions between the first and second electrode. This might be in a separate printing step, or combined with the printing of the second electrode. (FIG. 1b).

Figure 2:
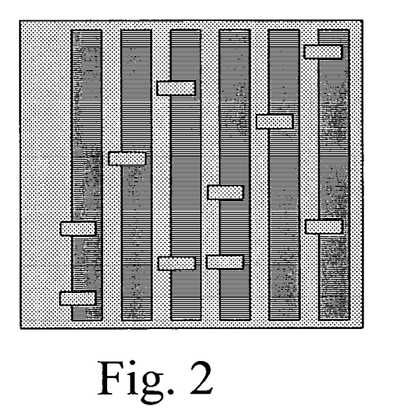
FIG. 2 illustrates a simple device in which the second electrode pattern is not printed.

FIG. 2 shows a more simple embodiment, in which the second electrode is not printed, but conductive bridges and conducting patches are only printed at pre-selected positions. Electrical readout will differentiate between an area where no conducting material is present (only insulating material on first electrode system) and an area where an isolated conducting area and conductive bridge is present.

Insulating Systems

The term insulating system, as used in disclosing the present invention, means a permanently insulating system i.e. a system whose properties are unchangeable under normal ambient conditions, whose resistance is unalterable by applying high voltage electrical pulses and excludes semiconducting layers whose conductivity can be influenced by doping, such as disclosed in U.S. Pat. No. 6,656,763, and conductive organic polymer layers whose conductivity state can change upon the application of a relatively large voltage differential between a first and a second electrode contiguous each continuous with one of the sides of the insulating system, such as disclosed in US 2004/0149552A1.

Suitable insulation materials are inorganic and organic materials e.g. polymeric materials such as homopolymers and copolymers selected, for example, from the group consisting of acrylates, olefins, methacrylates, acrylamides, methacrylamides, acrylonitrile, vinyl chloride, vinyl alcohol, vinylidene chloride, vinyl fluoride, vinylidene fluoride, other fluorinated ethylene compounds, vinyl alcohol, vinyl acetals, vinyl acetate, styrene and butadiene; inorganic fillers, such as silica, alumina, alumina hydrates, and inorganic fibres, such as glass fibres. The insulating system can also be a UV-curable ink or varnish.

Process for Producing the Memory Passive Device

Aspects of the present invention are realized by a process for providing a first passive memory device comprising at least one passive memory element and a support having at least one conductive surface or conductive layer on the at least one side provided with the passive memory element, the passive memory element comprising a first electrode system and a second electrode system, wherein the first electrode system is insulated from the second electrode system, wherein the first electrode system is a conductive surface, or a conductive layer; wherein the second electrode system is a plurality of isolated conductive areas optionally together with a plurality of conductive pins isolated from one another; wherein conductive bridges are present between at least one of the isolated conductive areas of the second electrode system and the first electrode system; wherein in the absence of the at least one conductive bridge there is no direct electrical contact between the first and the second patterned electrode systems; and wherein, with the exception of the first electrode system being the conductive surface of a metallic support, the systems and the conductive bridges are printable using conventional printing processes, comprising the steps of: providing the support, realizing the conductive layer on the support if the support is non-metallic; realizing a patterned insulating system on the conductive surface or conductive layer, providing a plurality of isolated conducting areas on the patterned insulating system, and providing conductive bridges at pre-designated points between at least one of the isolated conductive areas and the conductive surface or the conductive layer, wherein at least one of the steps of optionally providing a conductive layer, providing an patterned insulating system, providing a plurality of isolated conducting areas and providing conductive bridges is realized with a conventional printing process.

Aspects of the present invention are realized by a process for providing a second passive memory device, the passive memory device comprising at least one passive memory element and a support having at least one conductive surface or surface layer on the at least one side provided with the passive memory element, the passive memory element comprising the conductive surface of the support or the surface layer on the support as a first electrode system, an insulating system, at least one conductive blob is provided from at least one pre-designated point on the side of the insulating system not contiguous with the first electrode system to the first electrode system which makes a conductive bridge, for read-out purposes only, between the first and the second electrode systems upon one of the plurality of conductive pins of the second electrode system coming into contact with the part of the conductive blob on the patterned insulating system, wherein in the absence of the at least one conductive bridge there is no direct electrical contact between the first electrode system and second electrode system; and wherein, with the exception of the first electrode system being the conductive surface of a metallic support, the systems and the at least one conductive blob are printable using conventional printing processes, comprising the steps of: providing the support, realizing the conductive layer on the support if the support is non-metallic, realizing the patterned insulating system, providing at least one conductive blob from at least one predesignated point on the side of the insulating system not contiguous with the first electrode system to the conductive surface or the conductive layer and realizing a plurality of pins as the second electrode system for read-out purposes only, wherein at least one of the steps of optionally providing a conductive layer, providing the insulating system, providing the conductive blobs and providing the second electrode system is realized with a conventional printing process.

All the layers in the memory device, isolated conductive areas, insulating pattern system and 'conductive bridges', can be applied by conventional printing processes including but not restricted to ink-jet printing, intaglio printing, screen printing, flexographic printing, offset printing, stamp printing, gravure printing and thermal and laser-induced processes. Either one printing process can be used for all the layers in the memory device, or a combination of two or more printing processes can be used.

According to a first embodiment of the processes, according to the present invention, the first or second passive memory device is exclusive of metallic silicon.

According to a second embodiment of the processes, according to the present invention, the conventional printing process is a non-impact printing process e.g. ink-jet printing, electrophotographic printing and electrographic printing.

According to a third embodiment of the processes, according to the present invention, the conventional printing process is an impact printing process e.g. offset printing, screen printing, flexographic printing and stamp printing.

According to a fourth embodiment of the processes, according to the present invention, the conventional printing process is selected from the group consisting of ink-jet printing, intaglio printing, screen printing, flexographic printing, offset printing, stamp printing, gravure printing, electrophotographic printing, electrographic printing and thermal and laser-induced processes.

Printing according to the processes, according to the present invention, can be carried out directly on a package, on a label, a ticket, an ID-card, a bank card, a legal document and banknotes. The memory device may act as an identification system, a security feature, an anti-counterfeiting feature, etc.

According to a fifth embodiment of the process for providing a first passive memory device, according to the present invention, the insulating pattern, the second electrode pattern and the at least one conductive bridge are performed by the same printing process.

According to a sixth embodiment of the process for providing a first passive memory device, according to the present invention, the insulating pattern, the second electrode pattern and the at least one conductive bridge are performed by ink-jet printing.

According to a sixth embodiment of the process for providing a second passive memory device, according to the present invention, the process for providing a second passive memory device comprising a support having at least one conductive surface or surface layer and on at least one side of the support a passive memory element, the passive memory element comprising a conductive surface or the surface layer of the support, a plurality of isolated conductive areas and a patterned insulating system between the conductive surface of the metallic support and the plurality of isolated conducting areas, there being a conductive bridge between at least one predesignated isolated conductive areas of the plurality of isolated conductive areas and the conductive surface or surface layer of the support, and wherein each of a plurality of conducting pins makes contact with one of the plurality of isolated conducting areas, wherein the passive memory element is producible using conventional printing processes and is exclusive of silicon metal and in the absence of the at least one conductive bridge there is no direct electrical contact between the first and the second patterned electrode systems, comprises the steps of: realizing the insulating pattern system on the conductive surface layer, providing a plurality of isolated conducting areas on the insulating pattern system, and providing conductive bridges at predesignated points between at least one of the isolated conductive areas and the conductive surface layer, and bringing each of the isolated conductive areas into electrical contact with one of the conductive pins, wherein at least one of the steps of providing an insulating pattern system, providing a plurality of isolated conducting areas and providing conductive bridges is realized with a conventional printing process.

Conductive Screen Printing Inks

WO-A 02/079316 discloses an aqueous composition containing a polymer or copolymer of a 3,4-dialkoxythiophene in which the two alkoxy groups may be the same or different or together represent an optionally substituted oxy-alkylene-oxy bridge, a polyanion and a non-Newtonian binder; a method for preparing a conductive layer comprising: applying the above-described aqueous composition to an optionally subbed support, a dielectric layer, a phosphor layer or an optionally transparent conductive coating; and drying the thereby applied aqueous composition; antistatic and electroconductive coatings prepared according to the above-described method for preparing a conductive layer; a printing ink or paste comprising the above-described aqueous composition; and a printing process comprising: providing the above-described printing ink; printing the printing ink on an optionally subbed support, a dielectric layer, a phosphor layer or an optionally transparent conductive coating. The screen printing ink formulations disclosed in WO-A 02/079316 are specifically incorporated herein by reference.

WO-A 03/048228 discloses a method for preparing a composition containing between 0.08 and 3.0% by weight of polymer or copolymer of a 3,4-dialkoxythiophene in which the two alkoxy groups may be the same or different or together represent an optionally substituted oxy-alkylene-oxy bridge, a polyanion and at least one non-aqueous solvent from a dispersion of the polymer or copolymer of (3,4-dialkoxythiophene) and the polyanion in water which is prepared in the substantial absence of oxygen, comprising in the following order the steps of: i) mixing at least one of the non-aqueous solvents with the aqueous dispersion of the polymer or copolymer of (3,4-dialkoxythiophene) and the polyanion; and ii) evaporating water from the mixture prepared in step i) until the content of water therein is reduced by at least 65% by weight; a printing ink, printing paste or coating composition, capable of yielding layers with enhanced conductivity at a given transparency, prepared according to the above-described method; a coating process with the coating composition thereby producing a layer with enhanced conductivity at a given transparency; and a printing process with the printing ink or paste thereby producing a layer with enhanced conductivity at a given transparency. The screen printing ink formulations disclosed in WO-A 03/048228 are specifically incorporated herein by reference.

WO-A 03/048229 discloses a method for preparing a composition containing between 0.08 and 3.0% by weight of a polymer or copolymer of a 3,4-dialkoxythiophene in which the two alkoxy groups may be the same or different or together represent a oxy-alkylene-oxy bridge optionally substituted with substituents selected from the group consisting of alkyl, alkoxy, alkyoxyalkyl, carboxy, alkylsulphonato, alkyloxyalkylsulphonato and carboxy ester groups, a polyanion and at least one polyhydroxy non-aqueous solvent from a dispersion of the polymer or copolymer of (3,4-dialkoxythiophene) and the polyanion in water comprising in the following order the steps of: i) mixing at least one of the non-aqueous solvents with the aqueous dispersion of the polymer or copolymer of (3,4-dialkoxythiophene) and the polyanion; and ii) evaporating water from the mixture prepared in step i) until the content of water therein is reduced by at least 65% by weight; a printing ink, printing paste or coating composition, capable of yielding layers with an enhanced transparency at a given surface resistance, prepared according to the above-described method; a coating process with the coating composition thereby producing a layer with enhanced transparency at a given surface resistance; and a printing process with the printing ink or paste thereby producing a layer with enhanced transparency at a given surface resistance. The screen printing ink formulations disclosed in WO-A 03/048229 are specifically incorporated herein by reference.

Conductive Flexographic Printing Inks

WO-A 03/000765 discloses a non-dye containing flexographic ink containing a polymer or copolymer of a 3,4-dialkoxythiophene in which the two alkoxy groups may be the same or different or together represent an optionally substituted oxy-alkylene-oxy bridge, a polyanion and a latex binder in a solvent or aqueous medium, characterized in that the polymer or copolymer of a 3,4-dialkoxythiophene is present in a concentration of at least 0.1% by weight in the ink and that the ink is capable of producing a colorimetrically additive transparent print; a method of preparing the flexographic ink; and a flexographic printing process therewith. The flexographic printing ink formulations disclosed in WO-A 03/000765 are specifically incorporated herein by reference.

Conductive Ink-Jet Inks

Formulations containing a polymer or copolymer of a 3,4-dialkoxythiophene in which the two alkoxy groups may be the same or different or together represent an optionally substituted oxy-alkylene-oxy bridge, a polyanion and a high boiling point liquid in a solvent or aqueous medium can be prepared, which are suitable for ink-jet printing. Critical properties, such as the viscosity, which at the jetting temperature is preferably in the range of 3 to 15 mPa·s for a Universal Print Head (from AGFA-GEVAERT), can be adjusted by changing the concentration of conductive polymer and the amount and type of high boiling point liquid. A 1.2% by weight dispersion of PEDOT:PSS has a viscosity of approximately 30 mPa·s at room temperature and a 0.6% by weight dispersion has a viscosity at room temperature of approximately 10 mPa·s.

The surface tension is preferably in the range of 28 to 36 mN/m under jetting conditions for a Universal Print Head, and can be adjusted by adding appropriate anionic, cationic or non-ionic surfactants or solvents, e.g. alcohols. Surfactants can also influence the jetting performance, wetting properties of the ink on a substrate and the UV-stability of printed layers.

The addition of, for example, 5 to 20% by weight of high boiling point liquids improves the conductivity of the printed layer after drying; useful high boiling point liquids include ethylene glycol, diethylene glycol, propylene glycol, glycerol, N-methylpyrrolidon and 2-pyrrolidon. The choice of high boiling point liquid also has an influence on drying time, minimum drying temperature, jetting performance, wetting properties, viscosity and surface tension.

Optionally, volatile bases, such as dimethylethanolamine, triethylamine or diisopropylethylamine might be added to neutralize the inkjet printing solution to prevent corrosion of the print head.

INDUSTRIAL APPLICATION

The passive memory devices, according to the present invention, can be used in security and anti-counterfeiting applications e.g. in tickets, labels, tags, an ID-card, a bank card, a legal document, banknotes and packaging and can also be integrated into packaging.

The invention is illustrated hereinafter by way of comparative examples and invention examples. The percentages and ratios given in these examples are by weight unless otherwise indicated.

Commercial coatings used in the elements of the INVENTION EXAMPLES:
AGORIX MAGENTA INK, a UV-hardenable ink-jet ink from AGFA-DOTRIX N.V.;
ED4000, a carbon black ink from ELECTRA POLYMERS;
NORIPET® 093 Clear, an insulating screen printing ink from Pröll Ingredients used in non-commercial coatings used in the elements of the INVENTION EXAMPLES:
TANACOTE® FG3, an aqueous carboxylated polypropylene emulsion from SYBRON CHEMICALS;
PANIPOL® W, a 6% by weight aqueous dispersion of polyaniline from PANIPOL LTD.;
DYNOL® 604, an acetylenic glycol-based surfactant from AIR PRODUCTS.

INVENTION EXAMPLE 1

Fully Inkjet Printed Element with Conductive Pads

The passive memory element of INVENTION EXAMPLE 1 was produced by inkjet printing two layers of AGORIX Magenta INK on top of one another on four different conductive surfaces, using the Universal Printhead (from AGFA-GEVAERT) and then UV-cured, thereby forming an insulating line pattern consisting of 8 lines spaced 3 mm apart with dimensions of 55×2.5 mm². The four conductive surfaces used, were:
1) a 13 μm thick aluminium foil;
2) a Thermostar P970 aluminium offset printing plate (backside);
3) a subbed PET-substrate with a continuous layer of flexographic PEDOT: PSS ink:

| Invention Example nr 37 from WO-A 03/000765 | |
|---|---|
| 3 wt % aq. PEDOT/PSS dispersion [g] | 45 |
| Deionized water [g] | 14.4 |
| NEOCRYL ™ BT-9, a 40% by weight aqueous polyacrylate latex from ZENICA Resins [g] | 3.75 |
| TANACOTE ™ FG3 [g] | 1.4 |

| -continued | |
|---|---|
| Invention Example nr 37 from WO-A 03/000765 | |
| 1,2-propandiol [g] | 2.5 |
| diethylene glycol monomethyl ether [g] | 4.5 |
| diethylene glycol [g] | 7.0 |
| SYNPERONIC ™ 13/6.55, a tridecylpolyethylene-glycol from UNIQEMA [g] | 1.6 |
| X-50-860A, a silicone defoaming agent from Shin-Etsu [g] | 0.1 |
| isopropanol [g] | 20 |
| Total [g]: | 100.25 |
| wt % water in aq. medium | 64.3 |
| Viscosity [mPa · s] | 500 | applied via flexo printing and dried at 80° C. for 3 minutes; and
4) a subbed PET-substrate with a continuous silver layer, applied via a diffusion transfer reversal process with a non-exposed silver halide donor sheet (Copyproof Negative Film NPC from Agfa-Gevaert).

The second electrode system was produced by inkjet printing conductive pads of 1×4 mm with a PEDOT: PSS inkjet ink having the composition given in table 1, on top of the insulating pattern. Finally 'conductive bridges' were applied by inkjet printing lines of 1×3 mm using the Universal Printhead with the PEDOT: PSS ink-jet ink at pre-selected positions to form the conductive bridges.

TABLE 1

| | Concentration by weight |
|---|---|
| PEDOT: PSS 1.1% aqueous dispersion | 57.10% |
| Deionized water | 28.55% |
| N-methyl pyrrolidone | 14.20% |
| Dynol ® 604 | 0.15% |
| Dimethylethanolamine | to increase pH to 7-8 |

The resistance between the continuous first electrode and the second electrode pads was measured with a Fluke Multimeter and is given in table 2.

TABLE 2

| First electrode | Second electrode and conductive bridges | Resistance without bridge | Resistance with bridge |
|---|---|---|---|
| 1) Al-foil | Inkjet PEDOT: PSS | >30 MΩ | 20 kΩ |
| 2) Al-offset plate | Inkjet PEDOT: PSS | >30 MΩ | 10 MΩ |
| 3) flexographic PEDOT: PSS ink | Inkjet PEDOT: PSS | >30 MΩ | 100 kΩ |
| 4) Silver on PET | Inkjet PEDOT: PSS | >30 MΩ | 10 kΩ |

INVENTION EXAMPLE 2

Inkjet Printed Element without Conductive Pads

The passive memory element of INVENTION EXAMPLE 2 was produced as described in INVENTION EXAMPLE 1, with the exception that no second electrode pads were printed. In addition to ink-jet printing the conductive bridges with the PEDOT:PSS ink-jet ink, conductive bridges were also applied manually, using PANIPOL W and ED4000. The resistance is measured either between the continuous first electrode and a conductive bridge, or between the continuous first electrode and an area on the insulating pattern without conductive bridge, the results are given in Table 3.

TABLE 3

| First electrode | Conductive bridges | Resistance without bridge | Resistance with bridge |
|---|---|---|---|
| 1) Al-foil | Inkjet PEDOT: PSS | >30 MΩ | 20 kΩ |
|  | PANIPOL W | >30 MΩ | 200 Ω |
|  | ED4000 | >30 MΩ | 50 Ω |
| 2) Al-offset plate | Inkjet PEDOT: PSS | >30 MΩ | 10 MΩ |
|  | PANIPOL W | >30 MΩ | 10 kΩ |
|  | ED4000 | >30 MΩ | 250 Ω |
| 3) flexographic PEDOT ink | Inkjet PEDOT: PSS | >30 MΩ | 100 kΩ |
|  | PANIPOL W | >30 MΩ | 100 kΩ |
|  | ED4000 | >30 MΩ | 100 kΩ |
| 4) Silver on PET | Inkjet PEDOT: PSS | >30 MΩ | 10 kΩ |
|  | PANIPOL W | >30 MΩ | 700 Ω |
|  | ED4000 | >30 MΩ | 50 Ω |

INVENTION EXAMPLE 3

Fully Transparent Device via Combination of Screen and Inkjet Printing

The passive memory element of INVENTION EXAMPLE 3 was produced by screen printing lines with dimensions of 2×50 mm² spaced 1.5 mm apart using Noripet 093 Clear with a screen of mesh P79 on an ORGACON EL-1500 substrate and drying at 130° C. for 3 minutes.

Conductive bridges with or without second electrode pads were prepared by inkjet printing PEDOT: PSS, as described in INVENTION EXAMPLES 1 and 2. Electrical measurements were performed as described in INVENTION EXAMPLES 1 and 2 and results are given in Table 4.

TABLE 4

|  | Resistance |
|---|---|
| Without second electrode, without conductive bridge | >30 MΩ |
| Without second electrode, with conductive bridge | 50 kΩ |
| With second electrode, without conductive bridge | >30 MΩ |
| With second electrode, with conductive bridge | 50 kΩ |

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

Having described in detail preferred embodiments of the current invention, it will now be apparent to those skilled in the art that numerous modifications can be made therein without departing from the scope of the invention as defined in the following claims.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and similar referents in the context of describing the invention (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose a limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Of course, variations of those preferred embodiments will become apparent to those of ordinary skill in the art upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

We claim:

1. A first passive memory device comprising a support with two sides and provided with a passive memory element on at least one side thereof, said support having a conductive surface or surface layer on the at least one side provided with said passive memory element, said passive memory element comprising a first electrode system and a second electrode system, wherein the first electrode system is insulated from the second electrode system by a patterned insulating system, wherein the first electrode system is a conductive surface, or a conductive layer; wherein said second electrode system is a plurality of isolated conductive areas optionally together with a plurality of conductive pins isolated from one another; wherein conductive bridges are present between at least one of said isolated conductive areas of said second electrode system and said first electrode system; wherein in the absence of said at least one conductive bridge there is no direct electrical contact between said first and said second patterned electrode systems; and wherein, with the exception of said first electrode system being the conductive surface of a metallic support, said systems and said conductive bridges are printable using conventional printing processes, wherein said first passive memory device is transparent.

2. The first device according to claim 1, wherein at least one of said first and second patterned electrode systems comprises an inorganic conducting medium or an organic conducting medium.

3. A first passive memory device comprising a support with two sides and provided with a passive memory element on at least one side thereof, said support having a conductive surface or surface layer on the at least one side provided with said passive memory element, said passive memory element comprising a first electrode system and a second electrode system, wherein the first electrode system is insulated from the second electrode system by a patterned insulating system, wherein the first electrode system is a conductive surface, or a conductive layer; wherein said second electrode system is a plurality of isolated conductive areas optionally together with a plurality of conductive pins isolated from one another; wherein conductive bridges are present between at least one of said isolated conductive areas of said second electrode system and said first electrode system; wherein in the absence of said at least one conductive bridge there is no direct electrical contact between said first and said second patterned electrode systems; and wherein, with the exception of said first electrode system being the conductive surface of a metallic support, said systems and said conductive bridges are printable using conventional printing processes, wherein said conductive bridges are colored.

4. The first passive memory device according to claim 3, wherein said first passive memory device is exclusive of metallic silicon.

5. The first device according to claim 3, wherein at least one of said first and second patterned electrode systems comprises an inorganic conducting medium or an organic conducting medium.

6. A first passive memory device comprising a support with two sides and provided with a passive memory element on at least one side thereof, said support having a conductive surface or surface layer on the at least one side provided with said passive memory element, said passive memory element comprising a first electrode system and a second electrode system, wherein the first electrode system is insulated from the second electrode system by a patterned insulating system, wherein the first electrode system is a conductive surface, or a conductive layer; wherein said second electrode system is a plurality of isolated conductive areas optionally together with a plurality of conductive pins isolated from one another; wherein conductive bridges are present between at least one of said isolated conductive areas of said second electrode system and said first electrode system; wherein in the absence of said at least one conductive bridge there is no direct electrical contact between said first and said second patterned electrode systems; and wherein, with the exception of said first electrode system being the conductive surface of a metallic support, said systems and said conductive bridges are printable using conventional printing processes, said passive memory device is overprinted with an image or a homogeneously colored or opaque layer to visually hide the location of said conductive bridges.

7. The first passive memory device according to claim 6, wherein said first passive memory device is exclusive of metallic silicon.

8. The first device according to claim 6, wherein at least one of said first and second patterned electrode systems comprises an inorganic conducting medium or an organic conducting medium.

9. A first passive memory device comprising a support with two sides and provided with a passive memory element on at least one side thereof, said support having a conductive surface or surface layer on the at least one side provided with said passive memory element, said passive memory element comprising a first electrode system and a second electrode system, wherein the first electrode system is insulated from the second electrode system by a patterned insulating system, wherein the first electrode system is a conductive surface, or a conductive layer; wherein said second electrode system is a plurality of isolated conductive areas optionally together with a plurality of conductive pins isolated from one another; wherein conductive bridges are present between at least one of said isolated conductive areas of said second electrode system and said first electrode system; wherein in the absence of said at least one conductive bridge there is no direct electrical contact between said first and said second patterned electrode systems; and wherein, with the exception of said first electrode system being the conductive surface of a metallic support, said systems and said conductive bridges are printable using conventional printing processes, wherein a colored or opaque foil is laminated over said passive memory device to visually hide the location of said conductive bridges.

10. The first passive memory device according to claim 9, wherein said first passive memory device is exclusive of metallic silicon.

11. The first device according to claim 9, wherein at least one of said first and second patterned electrode systems comprises an inorganic conducting medium or an organic conducting medium.

* * * * *